(12) United States Patent
Hong et al.

(10) Patent No.: US 6,382,901 B1
(45) Date of Patent: May 7, 2002

(54) WAFER FLAT ZONE ALIGNER

(75) Inventors: Jong-Won Hong, Kunpo; Seoung-Jae Oh, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/847,346

(22) Filed: May 3, 2001

(30) Foreign Application Priority Data

Sep. 19, 2000 (KR) .............................................. 00-54931

(51) Int. Cl.$^7$ .............................................. B65G 47/24
(52) U.S. Cl. ........................ 414/757; 414/433; 414/936
(58) Field of Search ................................ 414/453, 757, 414/936; 198/394

(56) References Cited

U.S. PATENT DOCUMENTS

| | | | |
|---|---|---|---|
| 5,183,378 A | * 2/1993 | Asano et al. | 414/936 X |
| 5,533,243 A | * 7/1996 | Asano | 414/936 X |
| 5,853,284 A | 12/1998 | Ohzeki et al. | 414/757 |
| 5,970,818 A | * 10/1999 | Kikuchi et al. | 414/936 X |
| 6,222,339 B1 | * 4/2001 | Yamasaki et al. | 44/936 X |

* cited by examiner

Primary Examiner—Janice L. Krizek
(74) Attorney, Agent, or Firm—Volentine Francos, PLLC

(57) ABSTRACT

A wafer flat zone aligner prevents wafers from binding to the walls of a wafer cassette, that define the slots in which the wafers are seated, by restricting axial movement of the wafers while the wafers are being rotated by a wafer rotating roller of the aligner. To this end, the wafer rotating roller includes a shaft portion, and a plurality of spaced apart annular members protruding radially from the shaft portion. Each wafer seated in the cassette is inserted between adjacent ones of the annular members into contact with the shaft portion of the roller. When the roller is rotated, the shaft portion rotates the wafers while the wafers are constrained from moving in the axial direction of the roller by the annular members. The wafer aligner also includes a guide roller that is moved into contact with the wafers and causes the wafers to stop rotating when flat zones of the wafer arrive at the guide roller. The guide roller is made of an elastic material that produces little friction with the wafers so that neither the wafers nor the wafer guide roller itself will be damaged when the wafer guide roller is moved into contact with the wafers.

10 Claims, 4 Drawing Sheets

WAFER FLAT ZONE ALIGNER

BACKGROUND OF THE INVENTION

1. Field of the Invention

The present invention relates to the manufacturing of semiconductor devices. More particularly, the present invention relates to a wafer flat zone aligner for orienting wafers prior to their introduction into a facility in which the wafers are to be processed.

2. Description of the Related Art

Semiconductor products are being widely used in various industries, such as the electronics, computer and aerospace industries. Presently, such semiconductor products are under a rapid technical development to achieve high integration and high performance, i.e., so as to be capable of storing large amounts of data per unit area and/or so as to be capable of processing large amounts of data per unit time. The semiconductor products are fabricated by carrying out a plurality of very precise fabricating processes in facilities through which the overall semiconductor fabricating process progresses.

Data is stored or computations are performed in such semiconductor products by devices such as thin film transistors, thin film capacitors and thin film resistors. These semiconductor devices constitute minute electric circuits having a circuit pattern formed, based on a highly precise design rule of, for instance, about 0.10 microns, from a semiconductor thin film. In forming such accurate semiconductor thin film patterns, the above-mentioned semiconductor fabricating facilities perform very precise semiconductor thin film processes on a pure silicon wafer at each of numerous semiconductor chip areas formed on the wafer. Therefore, the wafer must be aligned with each semiconductor fabrication facility just before the semiconductor process is to be carried out in the facility on the numerous semiconductor chip areas formed on the wafer.

To this end, the wafer has a flat circumferential portion. This so-called "flat zone" of the wafer serves as a reference position in a process of aligning the wafer in preparation for introducing the wafer into the semiconductor fabrication facility in which the fabricating process is to be performed. Such a wafer having a flat zone is transferred to a wafer cassette after a first fabricating process is carried out, and is then transferred from the cassette to the next facility in which the subsequent semiconductor fabricating process is to be carried out. Thus, most semiconductor fabrication facilities perform a flat zone alignment process before the semiconductor fabricating process is carried out because the relative position of the wafer has likely changed from the designated position in the course of loading/unloading the wafer cassette or transferring the wafer.

The orienting of a wafer to a designated position is mainly carried out by a piece of equipment referred to as a flat zone aligner. The structure and operation of a typical flat zone aligner is described below.

A plurality of wafers are respectively disposed in slots of a wafer cassette having an open bottom. The wafer cassette is transferred to a designated position in the flat zone aligner. The flat zone aligner comprises two driving rollers made of a stainless material, and a guide roller made of quartz. The guide roller is disposed a little above the driving rollers. Once the cassette arrives at the designated position, the two driving rollers, and the guide roller are brought into contact with the wafers through the open bottom of the cassette.

The driving rollers are rotated by a motor while in contact with the circumference of the wafers. Any wafer having a flat zone that is not in alignment is contacted by the guide roller and the two driving rollers, and is rotated by the two driving rollers. Once the flat zone of the wafer confronts the guide roller, the wafer stops rotating and is thereby oriented in a position in which the wafer is aligned.

However, the wafer flat zone aligner described above causes several problems. For instance, the rollers can break or scratch the edge of the wafer. In addition, the aligner can produce particles when the rollers thereof collide with the wafers disposed in the slots of the wafer cassette.

Such problems can be caused by an inexact vertical displacement of the guide roller by an elevating mechanism of the wafer aligner. As mentioned above, the guide roller is made of quartz which is a hard but fairly brittle material. The pure silicon wafer is also hard but rather brittle. If the guide roller is raised too far by the elevating mechanism of the flat zone wafer aligner, the quartz guide roller and silicon wafers can collide with such an impact that the guide roller breaks, or the edge of the wafer cracks or breaks. In the case in which a fine crack is produced in the edge of the wafer, a mechanical stress concentration is produced at the crack when the wafer is thermally stressed during subsequent processing. As a result, the crack propagates from the edge to an active area of the wafer, thereby producing a defect in the semiconductor device(s).

The conventional wafer flat zone aligner can also scratch the wafers and produce particles as follows.

The flat zone aligner also includes a sensor unit for sensing whether there are wafers in the slots of the cassette. The sensor unit comprises confronting sensor plates that are inserted into the wafer cassette at positions at which each wafer, if disposed in a slot of the cassette, will lie between adjacent ones of the sensor plates. However, sometimes a wafer will butt up against an upper flat surface of one of the sensor plates as the sensor plates are inserted into the wafer cassette. Thus, the wafer will not come to lie in between adjacent ones of the sensor plates. Therefore, although this wafer is indeed present in a slot of the wafer cassette, the sensor unit issues an erroneous signal indicating that no wafer is present in the slot.

To avoid such problems, the wafer cassette is generally tilted in the wafer flat zone aligner by about 2 degrees relative to the horizontal. Accordingly, the wafers become tilted by about 2 degrees relative to the vertical so that as the sensor plates are inserted vertically into the cassette, the wafers present in the slots are self-guided, if necessary, to positions at which they become located between adjacent ones of the sensor plates.

The silicon wafers in such an inclined state are subsequently contacted and rotated by the driving rollers. Consequently, the wafers produce flutes in the circumference of the driving rollers due to friction. Due to the tilted state of the wafers, this flute extends over time as an oblique line relative to the outer circumference of the driving roller. Therefore, a portion of the wafer may be introduced into this flute during an alignment process and hence, will start to move along the flute, i.e., will start to move axially along the driving roller.

In this case, however, the other portion of the wafer is seated in the slot. Thus, the portion of the wafer contacting the driving roller is moved by the flute axially along the driving roller, but the other portion of the wafer seated in the slot can not move. Therefore, the wafer is driven into contact with the wafer slot and strongly collides with the wafer slot, thereby causing friction and noise, scratching the wafer, creating particles which may contaminate the wafer, and preventing the wafer from being rotated into the designated aligned position.

SUMMARY OF THE INVENTION

Accordingly, an object of the present invention is to provide a wafer flat zone aligner that substantially obviates one or more of the limitations and disadvantages of the prior art.

More specifically, one object of the present invention is to provide a wafer flat zone aligner that prevents wafers from being strongly forced against the walls of the cassette, that define the slots in which the wafers are seated, as the wafers are being rotated into designated aligned positions.

To achieve this object, the wafer flat zone aligner of the present invention comprises a wafer rotating roller that includes a shaft portion for rotating the wafers using friction, and a plurality of parallel spaced apart annular members protruding from the shaft portion. Each wafer seated in the cassette is inserted between adjacent ones of the annular members into contact with the shaft portion of the roller. As the wafers are being rotated by the shaft portion, the wafers are constrained from moving in the axial direction of the roller by the annular members. Thus, the wafers will not be forced against and bind to the walls of the cassette.

In addition, the shaft portion of the wafer rotating roller may have an outer jacket of silicone. The silicone will provide just enough friction with the wafers to overcome any force causing the wafers to adhere to the walls of the cassette.

Another object of the present invention is to provide a wafer flat zone aligner that when used will not cause an edge of a wafer to crack and will not prematurely degrade the guide roller thereof.

To achieve this object, the guide roller of the wafer aligner is made of an elastic material, such as polyethylene (PE) or polyetheretherketone (PEEK), that produces little friction with the wafers. Thus, neither the wafers nor the wafer guide roller itself will be damaged when the wafer guide roller is moved into contact with the wafers.

BRIEF DESCRIPTION OF THE DRAWINGS

These and other objects, features and advantages of the present invention will become more apparent from the following detailed description of the preferred embodiment, with reference to the accompanying drawings, in which.

DETAILED DESCRIPTION OF THE PREFERRED EMBODIMENTS

The preferred embodiments of the present invention will now be described in detail in connection with the accompanying drawings. The same or similar parts are designated by the same or similar reference numbers throughout the drawings.

Figure 1:
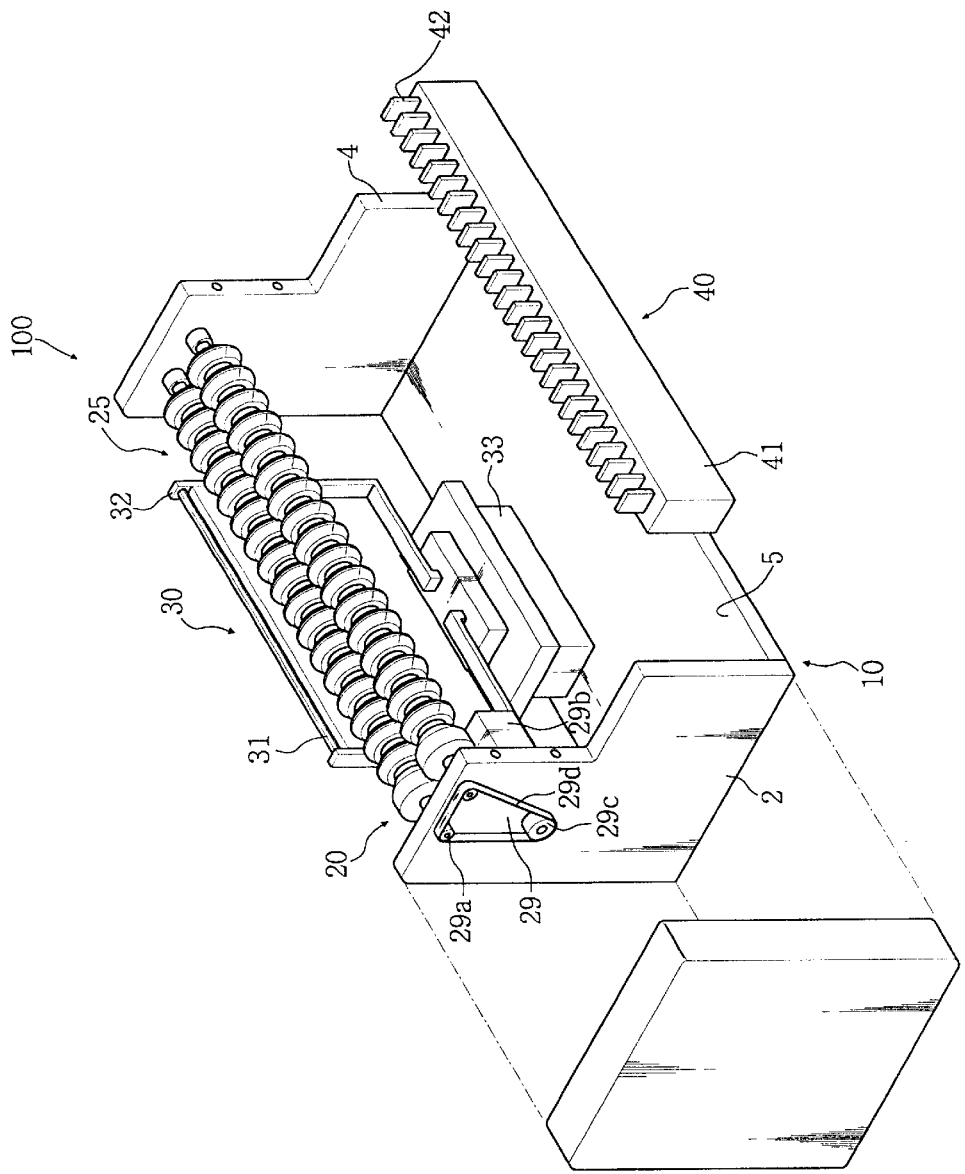
FIG. 1 is a perspective view of a wafer flat zone aligner in accordance with the present invention.

Referring first to FIG. 1, the flat zone aligner 100 of the present invention includes a housing 10, a wafer rotating unit 20, a wafer guide unit 30 and a wafer sensing unit 40.

The housing 10 comprises two upright vertical brackets 2, 4 and one horizontal bracket 5. The horizontal bracket 5 forms the bottom of the housing 10. The two vertical brackets 2, 4 extend perpendicularly from the ends of the horizontal bracket 5, respectively.

Figure 2:
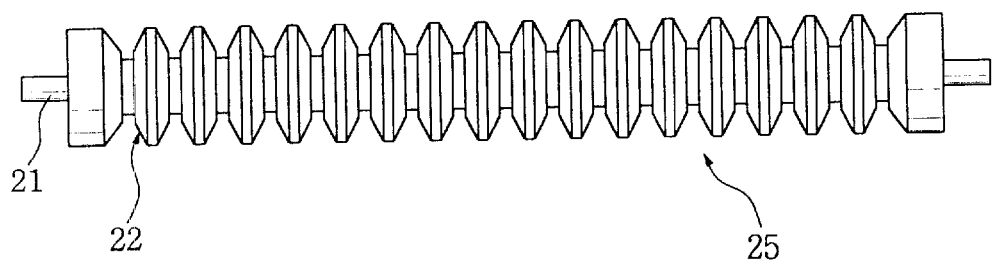
FIG. 2 is a front view of a wafer rotation driving roller of the wafer flat zone aligner of the present invention.
Figure 3:
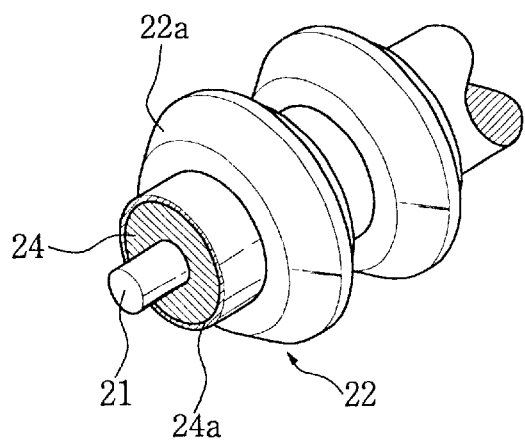
FIG. 3 is perspective view of an end portion of the wafer rotation driving roller.

Referring now to FIGS. 1 through 3, the wafer rotating unit 20 includes a pair of wafer rotation driving rollers 25 and a driving roller rotating unit 29. Each wafer rotation driving roller 25 comprises a shaft portion, and a plurality of annular members 22 extending around the shaft portion and protruding radially outwardly therefrom. The shaft portion, in turn, comprises a rotary shaft 21, a bushing 24 made of industrial grade engineering plastic and interposed between the rotary shaft 21 and the annular members 22, and an annular jacket 24a made of silicone covering the bushing 24.

The annular members 22 are made of engineering plastic such as PEEK or PE. Each of the annular members 22 has a base having opposite outer surfaces extending from and perpendicular to the outer circumferential surface of the shaft portion, and a tapered outer circumferential portion extending radially outwardly from the base. That is, the outer circumferential portion of each annular member 22 has opposite outer surfaces that extend towards each other as taken in a direction radially outwardly from the base so as to define chamfers or fillets 22a. As the rotation driving rollers 25 are raised into the wafer cassette, the chamfers or fillets 22a serve to guide the lowermost circumferential portions of the wafers towards the base of the annular members 22 and into contact with the shaft portion (see FIG. 5). The annular members 22 are wide enough, i.e. have sufficient outer diameters, to prevent a wafer guided into contact with the shaft portion from rising over an adjacent annular member 22 during high-speed rotation of the rotary shaft 21. That is, the circumferential portion of each wafer is readily guided against the shaft portion as interposed between adjacent ones of the annular members 22, but thereafter can only move laterally between the adjacent annular members 22. Accordingly, during the alignment process (described in detail later on), the wafer can not bump into an adjacent wafer nor will the wafer be driven against the walls of the cassette 7 that define the slot in which the wafer is seated.

Moreover, as was described in connection with the prior art, the wafers can adhere to the walls defining the wafer slots of the cassette due to slight axial movement of the wafers during the alignment process. Such adhering, in turn, prevents the wafers from being rotated into the designated aligned positions. However, the shaft portions of the driving rollers 25 of the wafer aligner of the present invention each comprise an outer jacket 24a made of silicone. The jacket 24a thus generates a lot of friction with the circumferential portions of the wafers in contact therewith during rotation of the driving rollers 25. The friction is sufficient to overcome any force binding the wafers to the cassette 7. Accordingly, the wafers will be rotated to their designated aligned positions.

The bushing 24 is mounted to the shaft 21, the annular members 22 are secured to the bushing 24, and the jacket 24a comprises a plurality of tubular segments that are each interposed between adjacent ones of the annular members 22. The segments of the jacket 24a can be removed from the bushing 24 and replaced when they become excessively worn or abraded by the wafers. However, the present invention is not limited to such an arrangement.

For instance, the shaft portion and the annular members 22 can be formed as a unitary body by injection molding of PEEK or PE. Once the molded body is formed, the segments of the silicone jacket 24a can be inserted onto the shaft portion between adjacent ones of the annular members 22.

Referring now back to FIG. 1, the pair of wafer rotation driving rollers 25 extend between and are supported by the vertical brackets 2, 4 of the housing 10. More specifically, the brackets 2, 4 include journal or other bearings disposed across from one another. The ends of the rotary shaft 21 of each wafer rotation driving roller 25 extend into and are rotatably supported by respective ones of the bearings of the brackets 2, 4. As shown best in FIG. 2, one end of each rotary shaft 21 projects from the bushing 24. These projecting ends of the rotary shafts 21 of the wafer rotation driving rollers 25 extend through the bracket 2. The driving roller rotating unit 29 is connected to the wafer rotation driving rollers 25 at the projecting ends of the rotary shafts 21 thereof.

The driving roller rotating unit 29 includes (FIG. 1) two driven pulleys 29a secured to the projecting ends of the rotary shafts 21, a driving motor 29b, a driving pulley 29c and a tension transferring belt 29d wrapped around the pulleys 29a and 29c.

On the other hand, the wafer guide unit 30 includes a guide roller 31, a guide roller bracket 32 and an elevator 33 comprising a cylinder and vertically displaceable piston. The guide roller 31 is made of PEEK or PE. Such material has elasticity so as not to crack or break the edges of the wafers when the guide roller 31 is raised into contact therewith. The PEEK or PE also has a low coefficient of friction with silicon, i.e. the material of the wafer, so that the guide roller 31 will slip when it comes into contact with the flat zone of a wafer. The guide roller 31 is rotatably supported by the guide roller bracket 32, and the guide roller bracket 32 is supported by the elevator 33 so as to be movable up and down by the piston of the elevator 33.

The wafer sensing unit 40 comprises a wafer sensing block 41 and a plurality of wafer sensing sensor plates 42 mounted to the wafer sensor block 41 at the upper surface thereof. The sensor plates 42 are juxtaposed alongside the annular members 22 of a driving roller 25. Each sensor plate 42 includes a light-emitting sensor on one side (the left) thereof and a light-receiving sensor on the other side (the right) thereof. Thus, when a wafer is not present between an adjacent pair of the sensor plates 42, light from the light-emitting element of one of the sensor plates is detected by the light-receiving element of the other sensor plate. On the other hand, when a wafer is present between an adjacent pair of the sensor plates 42, the wafer blocks the light emitted by the light-emitting element of one of the sensor plates so that the light is not received by the light-receiving element of the other sensor plate.

Figure 4:
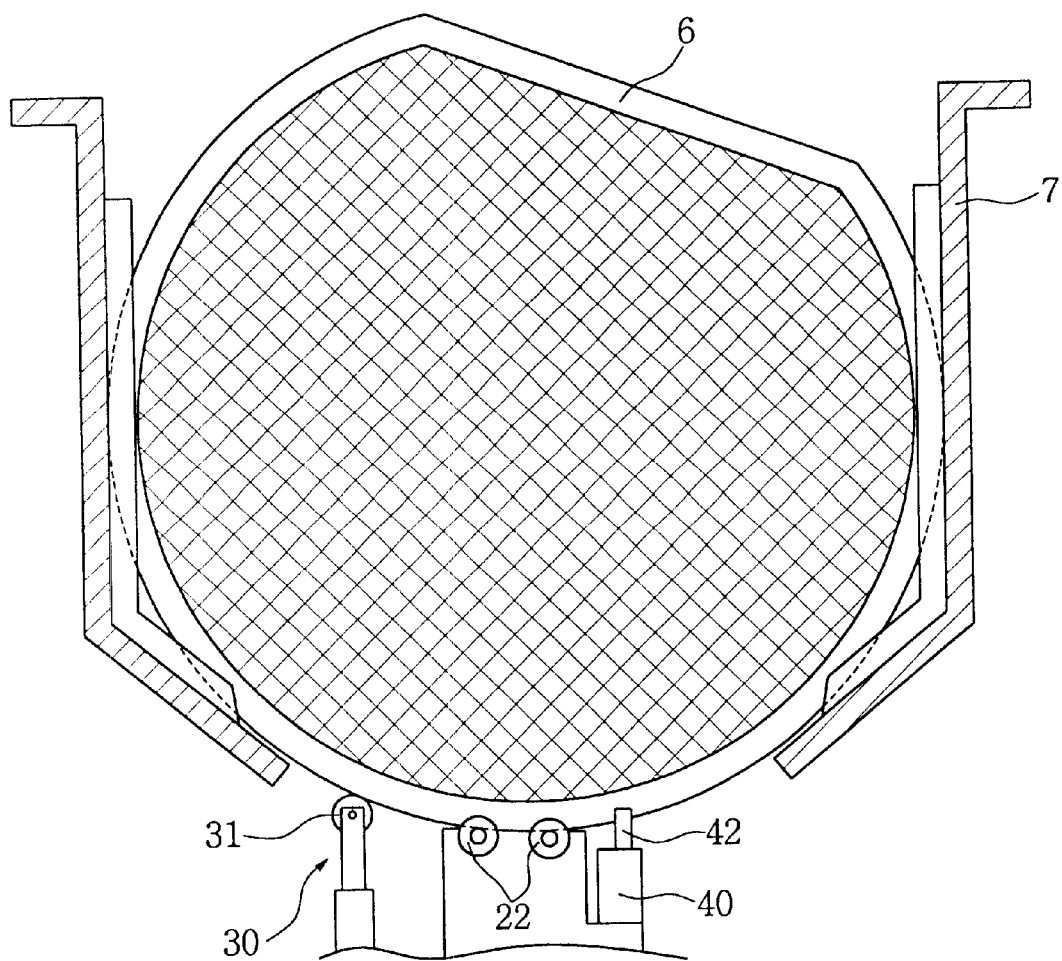
FIG. 4 is a side view of the wafer flat zone aligner in accordance with the present invention, during operation.
Figure 5:
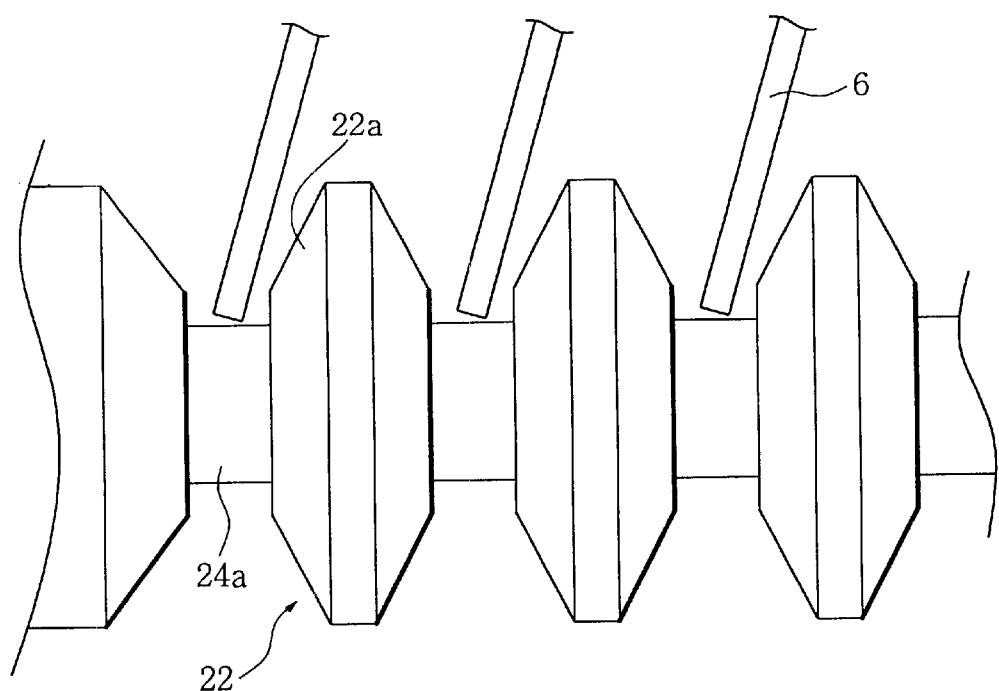
FIG. 5 is a front view of the end portion of the wafer rotation driving roller of the wafer flat zone aligner during operation.

The operation of the wafer flat zone aligner 100 will now be described with reference to FIGS. 4 and 5.

After being processed, a plurality of wafers 6 are loaded in a wafer cassette 7. The wafer cassette 7 is then transferred to the wafer flat zone aligner 100 so that the wafers 6 can be aligned with the next semiconductor fabricating facility in which the wafers are to be processed.

The flat zone alignment process is initiated by lowering the wafer cassette 7 onto the flat zone aligner 100 atop the housing 10 so that the wafers 6 are inserted between the annular members 22 of the wafer rotating unit 20. Then, the guide roller 31 of the wafer guide unit 30 is urged upwardly by the elevator 33 into contact with the wafers 6.

In this state, if the arcuate portion of the circumferential surface the wafer 6 is in contact with the guide roller 31, and the wafer rotation driving rollers 25 start to rotate, the wafer begins to rotate as held in place between adjacent ones of the annular members 22. Once the flat zone of the wafer 6 arrives at the guide roller 31, the driving rollers 25 will no longer rotate the wafer 6. Hence, the wafer is set in the designated aligned position.

In this way, all of the wafers 6 in the wafer cassette are set in the designated aligned positions. Then, the wafer cassette 7 is transferred into the semiconductor fabricating facility where a semiconductor fabricating process is carried out on the wafers.

As mentioned above, the driving roller(s) for rotating the wafers into the aligned positions includes annular members for limiting the ability of the wafers to move axially along the driving roller. Thus, the wafers will not bind with the walls of the cassette that define the slots in which the wafers are seated. Accordingly, the wafers are left free to rotate into the desired aligned positions. In addition, the wafer guide roller is made of an elastic material that will produce a low amount of friction with the wafers. Therefore, the wafer guide roller will not break, and will not break or crack the wafers when it is raised into contact with the wafers.

Finally, although the present invention has been described above in connection with certain preferred embodiments thereof, various changes thereto and modifications thereof will become apparent to those skilled in the art. Thus, all such changes and modifications are seen to be within the true spirit and scope of the invention as defined by the appended claims.

What is claimed is:

1. A wafer flat zone aligner for setting wafers seated in slots of a wafer cassette into designated aligned positions, said aligner comprising:

a housing;

at least one wafer rotation driving roller supported by said housing so as to be rotatable about a longitudinal axis of rotation, each said at least one wafer rotation driving roller having a shaft portion, and a plurality of annular members extending around said shaft portion, protruding radially outwardly from said shaft portion, and spaced from one another in the axial direction of said shaft portion;

a motor operatively connected to said at least one driving roller so as to rotate the roller;

a wafer guide roller disposed alongside said at least one wafer rotation driving roller and having a longitudinal axis of rotation parallel to that of said at least one wafer rotation driving roller, said wafer guide roller being of a material selected from the group consisting of industrial grade PEEK and PE plastic, and said wafer guide roller being supported so as to be freely rotatable, whereby said wafer guide roller is an idler roller;

a guide roller bracket to which said wafer guide roller is rotatably mounted, said guide roller bracket being discrete from the housing that supports said at least one wafer rotation driving roller; and an elevator connected to said guide roller bracket independently of said housing so as to move said bracket and said wafer guide roller mounted thereto up and down relative to both said housing and to the at least one wafer rotation driving roller supported by said housing.

2. The wafer flat zone aligner of claim 1, wherein each of said annular members has a base having opposite outer surfaces extending from said shaft portion perpendicular to the longitudinal axis of rotation of the driving roller, and an outer circumferential portion having opposite outer surfaces that extend towards each other as taken in a direction radially outwardly from the base, whereby the outer circumferential portion of the annular member tapers in the radially outward direction.

3. The wafer flat zone aligner of claim 1, and further comprising a wafer sensing unit including a plurality of sensor plates juxtaposed alongside the annular members of said at least one wafer rotation driving roller.

4. The wafer flat zone aligner of claim 1, wherein said shaft portion of each said at least one wafer driving rotation roller includes a central rotary shaft, and a jacket of silicone extending around said rotary shaft and exposed in each of spaces defined between adjacent ones of said annular members.

5. The wafer flat zone aligner of claim 4, wherein said rotary shaft and said annular members are each made of a material selected from the group consisting of industrial grade PEEK and PE plastic.

6. The combination of a wafer cassette and wafer flat zone aligner for setting wafers loaded in the cassette to designated aligned positions, the cassette having inner walls defining a plurality of horizontally spaced apart and vertically extending slots configured to receive the wafers, respectively, and an open bottom through which lower circumferential portions of wafers seated in the slots will be exposed, and said wafer flat zone aligner comprising:
a housing on which said cassette is to be set in position,
at least one wafer rotation driving roller supported by said housing so as to be rotatable about a longitudinal axis of rotation, each said at least one wafer rotation driving roller having a shaft portion that will contact the lower circumferential portions of the wafers seated in the slots of the cassette when the cassette is set on top of said housing of the aligner, and a plurality of annular members extending around said shaft portion, protruding radially outwardly from said shaft portion, and spaced from one another in the axial direction of said shaft portion by increments corresponding to those at which slots of the cassette are spaced from one another such that the lower circumferential portion of each wafer seated in a slot of the cassette set atop the aligner will be received between adjacent ones of said annular members, whereby the annular members limit the movement of the lower circumferential portions of the wafers in the axial direction of said shaft portion, a motor operatively connected to said at least one driving roller so as to rotate the roller, a wafer guide roller disposed alongside said at least one wafer rotation driving roller and having a longitudinal axis of rotation parallel to that of said at least one driving roller, said wafer guide roller being of a material selected from the group consisting of industrial grade PEEK and PE plastic, and said wafer guide roller being supported so as to be freely rotatable, whereby said wafer guide roller is an idler roller;

a guide roller bracket to which said wafer guide roller is rotatably mounted, said guide roller bracket being discrete from the housing that supports said at least one wafer rotation driving roller; and an elevator connected to said guide roller bracket independently of said housing so as to move said bracket and said wafer guide roller mounted thereto up and down relative to both said housing and to the at least one wafer rotation driving roller supported by said housing.

7. The combination of a wafer cassette and a wafer flat zone aligner of claim 6, wherein each of said annular members has a base having opposite outer surfaces extending from said shaft portion perpendicular to the longitudinal axis of rotation of the driving roller, and an outer circumferential portion having opposite outer surfaces that extend towards each other as taken in a direction radially outwardly from the base, whereby the outer circumferential portion of the annular member tapers in the radially outward direction so as to guide the lower circumferential portions of the wafers onto said shaft portion.

8. The combination of a wafer cassette and a wafer flat zone aligner of claim 6, and further comprising a wafer sensing unit including a plurality of sensor plates juxtaposed alongside the annular members of said at least one wafer rotation driving roller.

9. The combination of a wafer cassette and a wafer flat zone aligner of claim 6, wherein said shaft portion includes a central rotary shaft, and a jacket of silicone extending around said rotary shaft and exposed in each of spaces defined between adjacent ones of said annular members.

10. The combination of a wafer cassette and a wafer flat zone aligner of claim 9, wherein said rotary shaft and said annular members are each made of a material selected from the group consisting of industrial grade PEEK and PE plastic.

* * * * *